United States Patent [19]

Down

[11] Patent Number: 4,483,269

[45] Date of Patent: Nov. 20, 1984

[54] FIXTURE FOR USE IN FLUXING, SOLDER COATING AND HOT AIR LEVELLING

[75] Inventor: William H. Down, Quebec, Canada

[73] Assignee: Electrovert, Ltd., Ontario, Canada

[21] Appl. No.: 268,357

[22] Filed: May 29, 1981

[51] Int. Cl.³ .............................................. B05C 13/02
[52] U.S. Cl. .................................. 118/503; 118/423; 228/47
[58] Field of Search ...................... 228/47, 40; 427/96, 427/433; 34/239; 432/253, 261; 118/503, 423

[56] References Cited

U.S. PATENT DOCUMENTS 2,521,100  9/1950  Sublette ............................ 34/239 X
3,503,319  3/1970  Beuchner ........................ 269/287 X

OTHER PUBLICATIONS

Perry, R. H. and Chilton, C. H. (editors), *Chemical Engineers' Handbook*, New York, McGraw-Hill Book Company, 1973, pp. 23-63.

Weast, R. E. and Selby, S. M. (editors), *Handbook of Chemistry and Physics*, Cleveland, The Chemical Rubber Co., 1966, p. F-115.

*Primary Examiner*—Evan K. Lawrence
*Attorney, Agent, or Firm*—Darby & Darby

[57] ABSTRACT

A fixture for holding flexible printed circuit board substrates formed by front and rear screens each of a wire mesh material which are hingedly connected together and held at their top by a fastening arrangement such that the flexible substrate may be held therebetween, the material of the screen (e.g., titanium) being non-wettable by and capable of withstanding the temperature of molten solder.

11 Claims, 2 Drawing Figures

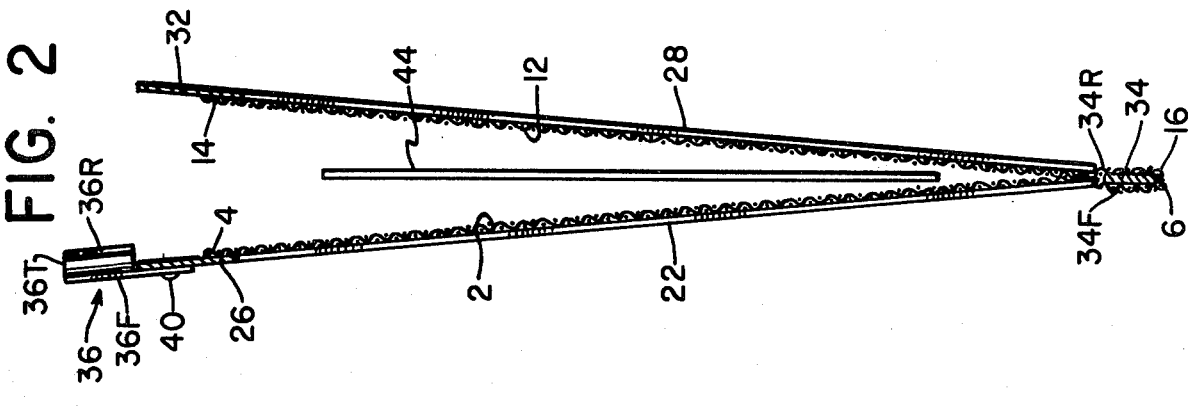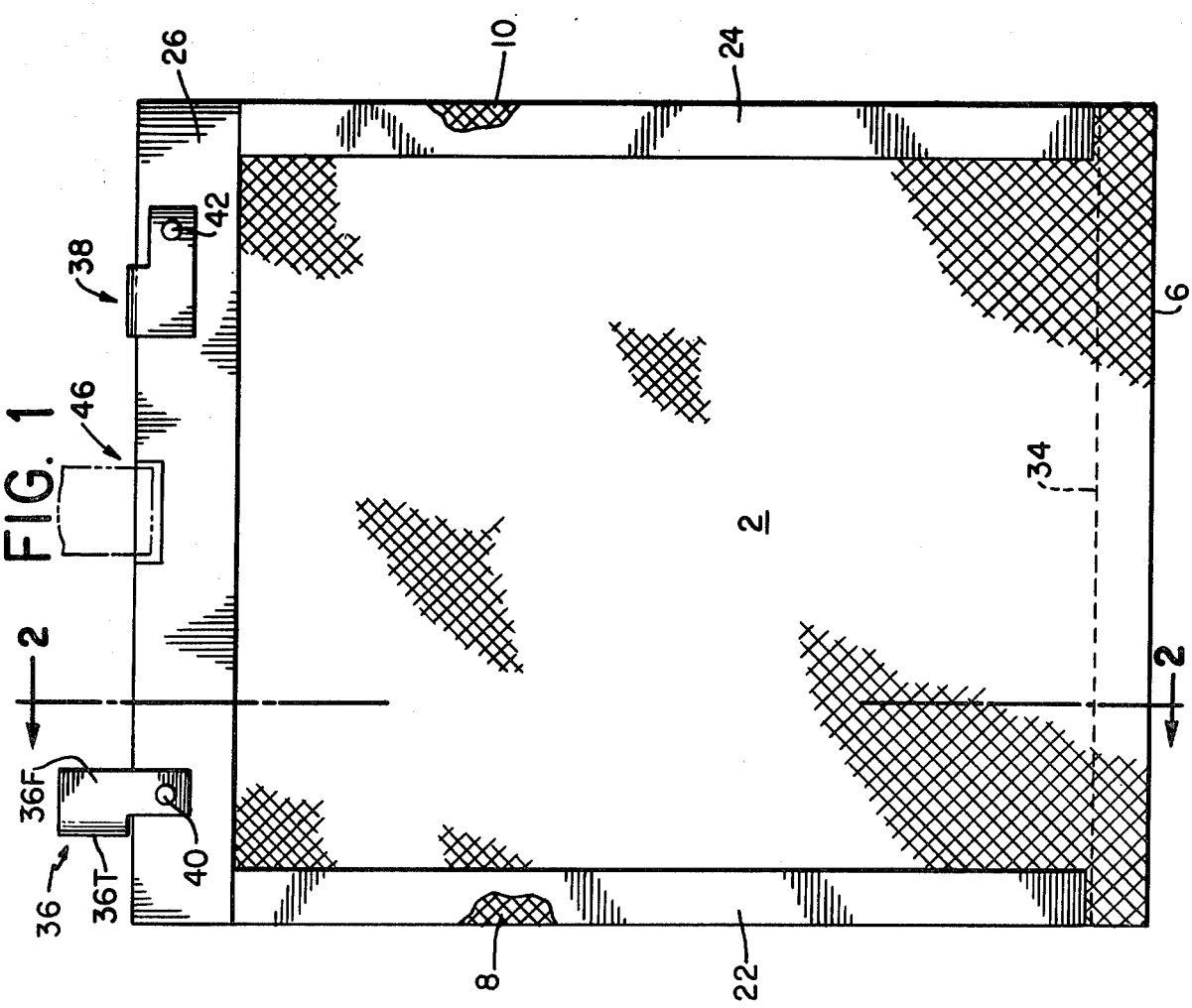

FIXTURE FOR USE IN FLUXING, SOLDER COATING AND HOT AIR LEVELLING

BACKGROUND OF THE INVENTION

1. Field of the Invention

This invention pertains to the manufacture of printed circuits, particularly to a fixture for holding flexible printed circuits during the time that such boards are being processed, for example, having molten solder removed. In such manufacture, a plastic substrate contains conductive areas and plated throughgoing holes, in order to receive leads from electrical components which are to be placed on and soldered to the printed circuit.

2. Description of the Prior Art

U.S. Pat. No. 3,865,298 discloses an apparatus used in the manufacture of rigid printed circuits. In this apparatus, a plastic substrate containing conductive areas and plated throughgoing holes is fluxed with a suitable flux by, e.g., dipping, swabbing, or immersion. Subsequently, the fluxed plastic substrate is contacted with molten solder by, e.g., immersion into a molten solder bath.

After this latter immersion in the molten solder bath, the semi-finished printed circuit is withdrawn from the bath and is subjected to streams of hot gas, preferably hot air. These streams of hot gas perform the functions of clearing excess solder from the holes in the substrate and leveling the layers of solder on the semi-finished printed circuit so that a solder layer of a uniform thickness is produced.

Within the apparatus disclosed in the above-mentioned U.S. Pat. No. 3,865,298, the semi-finished printed circuit travels in a well-defined plane. The streams of hot gas are produced by hot air knives which are precisely situated relative to the path traversed by the semi-finished printed circuit. In the event that the semi-finished printed circuit did not move along a well-defined path, the distances between the semi-finished circuit and the hot air knives would vary excessively. This variation would make the solder thickness less uniform, and might leave at least some of the holes obstructed by excess solder.

The apparatus disclosed in this reference is adequate for removing solder from conventional rigid substrates. However, when used to remove solder from flexible substrates, this apparatus produces unsatisfactory results. When flexible substrates are subjected to the streams of hot gas, they do not remain planar. Therefore, they do not travel along a precise and well-defined path, so that the layer of solder is irregular in thickness and the holes in the flexible substrate are sometimes blocked by solder. These problems cannot be solved by supporting the edges of the flexible substrate alone, because flexing will take place intermediate any points or lines of such edge support.

Therefore, it would be advantageous to provide an apparatus and a process which would permit solder removal from flexible substrates using the techniques disclosed in the above-mentioned reference.

SUMMARY OF THE INVENTION

Therefore, the object of this invention is to provide a fixture which will permit removal of solder from and levelling of solder remaining on a flexible substrate held by the fixture, when such removal is performed by streams of hot gas. Further object is to permit such operations on flexible substrates which are irregularily shaped.

In order to accomplish this object, the flexible substrate is placed in a fixture which prevents the flexible substrate from flexing during its exposure to streams of hot gas. The fixture includes a rear screen and a front screen. The bottom of both screens are hinged relative to each other. The tops of the screens are detachably securable closely adjacent each other, to permit the screens to be separated when a flexible substrate is to be introduced therebetwen or withdrawn therefrom as a finished flexible printed circuit, and to permit the screens to be clasped together to fix the flexible substrate in position therebetween. The screens may be reinforced, but are in any event sufficiently rigid when clasped together, that the screens and the flexible substrate fixed therebetween can be processed as if the entire assembly were a rigid printed circuit board. The screens are of a mesh which is sufficiently large that the fluxing, solder coating, and levelling of the solder and the clearing of the holes can take place satisfactorily.

BRIEF DESCRIPTION OF THE DRAWINGS

FIG. 1 is a front view of a fixture according to the invention; and

FIG. 2 is a view along sightline 2—2 on FIG. 1 showing a flexible substrate in the fixture while the fixture is in its open position.

DETAILED DESCRIPTION OF A PREFERRED EMBODIMENT

A front screen 2 is fabricated of a wire mesh from e,g., stainless steel and having a wire diameter of, e.g., 0.050 inches and a mesh spacing of, e.g., ¼ inch. Front screen 2 can also be made of titanium. It will be understood that the type and diameter of the wire and the spacing of the mesh can be varied in accordance with the types of flexible semi-finished printed circuits from which solder is to be removed. Front screen 2 has a rectangular shape with a top 4, a bottom 6, and two sides 8 and 10.

Rear screen 12 is identical to front screen 2, and has a top 14, a bottom 16, and two sides 18 and 20.

Sides 8 and 10 of front screen 2 are reinforced on their outward surfaces by flat and elongated front reinforcing elements 22 and 24 respectively. Here, these front reinforcing elements 22 and 24 are rigid, flat, elongated strips of a suitable relatively rigid material, such as 16 gauge stainless steel or titanium. Top 4 of front screen 2 is similarly reinforced by front reinforcing element 26, which is made of the same material as front reinforcing elements 22 and 24.

In a similar manner, rear screen 12 is reinforced by rear reinforcing elements (not shown) which correspond to the front reinforcing elements. Thus, rear reinforcing elements extend along the sides (not shown) of rear screen 12 respectively, and rear reinforcing element 32 extends along top 14 thereof. All of the reinforcing elements are attached to the front and rear screens 2 and 12 by means of welding, although alternate methods of attachment may of course be used.

Bottoms 6 and 16 of front and rear screens 2 and 12 respectively are attached to a bottom strip 34, which here is a flat and elongated strip of a suitable material, such as 16 gauge stainless steel or titanium bottom strip 34 has two opposed faces, namely front face 34F and rear face 34R. As in the case of the reinforcing elements, the screen material of the front screen 2 and rear screen 12 are welded to front face 34F and rear face 34R respectively, although any other suitable means of attachment may be employed. A hinge is formed by the screen material itself of either the front or rear screens. That is the respective screen, say the front screen 2 bends along the mesh material.

All the reinforcing elements are placed on the outward facing surfaces of the front and rear screens 2 and 12, so that when front and rear reinforcing elements 26 and 32 are brought together, front and rear screens 2 and 12 will be substantially parallel to each other and will abut each other when no flexible substrate is located between them. It will be immediately apparent that the location of the front and rear reinforcing elements may be switched from the outward facing surfaces of front and rear screens 2 and 12 to the inward facing surfaces thereof. The purpose of reinforcing front the rear screens 2 and 12 is to insure that they are as planar and as close together as possible. Additionally, the front and rear reinforcing elements serve to provide flat exterior siderails on each side of the fixture, which siderails can be inserted into a suitable track.

In order to detachably secure tops 4 and 14 of front and rear screens 2 and 12 respectively adjacent each other when front and rear screens 2 and 12 abut each other, two clamps generally indicated by reference numerals 36 and 38 are provided. Clamps 36 and 38 are forward of and are pivotally secured to front reinforcing element 26 by shafts 40 and 42 respectively. Shafts 40 and 42 may be rivets, screws, or any other suitable fasteners which will permit clamps 36 and 38 to rotate with respect of front reinforcing element 26.

Clamps 36 and 38 are mirror images of each other and are each manufactured of a single piece of plate material such as stainless steel or titanium which is bent or otherwise formed into the shape desired. Since clamps 36 and 38 function identically, a description of clamp 36 (which is visible in its raised position in FIG. 2) will suffice for both. Clamp 36 has a flat front flange 36F which is parallel to and slides upon front reinforcing element 26 when clamp 36 is rotated. At that end of front flange 36F which is remote from shaft 40, front flange 36F extends perpendicularly to the plane of front screen 2 to form a top flange 36T. Hence, front flange 36F and top flange 36T are perpendicular to each other. At that end of top flange 36T which is most remote from the outward surface of front screen 2, clamp 36 is bent once against to form a rear flange 36R which is parallel to front flange 36F. Thus, front flange 36F, top flange 36T and rear flange 36R have a U-shaped cross-section.

Front flange 36F and rear flange 36R are spaced a distance apart which is equal to the sum of the thicknesses of front reinforcing element 26, rear reinforcing element 32, and front and rear screens 2 and 12. Therefore, when the tops 4 and 14 of front and rear screens 2 and 12 abut each other, clamp 36 can be pivoted clockwise (as viewed in FIG. 1) to secure these front and rear screens 2 and 12 close together. On the other hand, when clamp 36 is rotated counter-clockwise, both these front and rear reinforcing elements 26 and 32 are free to move with respect to each other, permitting them and tops 4 and 24 to be separated.

In the method according to the invention, the front and rear reinforcing elements 26 and 32 are initially separated from each other and clamps 36 and 38 are in their upright positions. A flexible substrate 44 can then be introduced between front screen 2 and rear screen 12. After such introduction, tops 4 and 14 of front and rear screens 2 and 12 are brought together, and clamps 36 and 38 are rotated to their horizontal positions in order to fix the flexible substrate in position between the front and rear screens 2 and 12. Next, an arm, carrying hook, or like element is attached to rear reinforcing element 32 at the location indicated by reference numeral 46 in FIG. 1.

With the clasping of substrate 44 between front and rear screens 2 and 12, the entire fixture with flexible substrate 44 therein can be dipped into (or otherwise contacted with) a bath of flux. Regardless of the manner in which such contacting takes place, the flux passes through the front and rear screens 2 and 12 and fluxes substrate 44. Next, the fixture and fluxed substrate 44 are then removed from contact with the flux and are contacted by molten solder by, e.g., immersing the fixture and fluxed substrate 44 into a bath of molten solder. The molten solder passes through the front and rear screens 2 and 12. Thereafter, the semi-finished flexible printed circuit 44 so manufactured is subjected to streams of hot gas which pass through the front and rear screens 2 and 12, clearing holes in the semi-finished flexible printed circuit 44 of excess solder and levelling out the thickness of the solder layer.

In order to protect all the metal components of the fixture from deterioration caused by the flux and the molten solder, the entire fixture is coated with a protective coating, which here is a synergistic coating of TEFLON which is a registered trademark of DuPont Corporation for tetrafluoroethylene, which permeates all the elements in the fixture. This coating need not be TEFLON; another coating which is inert to solder and which is resistant to corrosion may be used instead. It will be appreciated that the arm, carrying hook or like element can be attached anywhere along the periphery of the fixture, and need not be attached to its top, although this latter is presently preferred.

What is claimed is:

1. A fixture for holding flexible printed circuit substrates which are to be immersed in a bath of molten solder, comprising:
   a rear titanium metal wire mesh screen having a top, a bottom, and two sides;
   a front titanium metal wire mesh screen having a top, a bottom, and two sides;
   means for hingedly connecting the rear and front screens together adjacent the bottoms thereof; the titanium material of said front and rear screens being non-wettable by and capable of withstanding the temperature of molten solder; and
   means for detachably securing the tops of the rear screen and the front screen such that the metal wire meshes are closely adjacent each other with a substrate held therebetween.

2. The fixture defined by claim 1, further comprising means for fixing the bottom of said rear screen with respect to the bottom of the front screen, said means for fixing and said means for detachably securing cooperating in a manner such that when the fixture is empty and the tops and the front and rear screens are secured closely adjacent each other, the front and rear screens are substantially parallel throughout a substantial portion of their respective areas.

3. The fixture defined by claim 2, wherein said means for fixing is a rigid flat metal strip to which the bottoms of the metal wire meshes of the rear and front screens are attached on opposed faces of the strip.

4. A fixture for holding flexible printed circuit substrates which are to be immersed in a bath of molten solder, comprising:

a rear metal wire mesh screen having a top, a bottom, and two sides;

a front metal wire mesh screen having a top, a bottom, and two sides;

means for hingedly connecting the rear and front screens together adjacent the bottoms thereof; the metal material of said front and rear screens being non-wettable by and capable of withstanding the temperature of molten solder;

means for detachably securing the tops of the rear screen and the front screen such that the metal wire meshes are closely adjacent each other with a substrate held therebetween, and said means for hingedly connecting the front and rear screens bringing said screens into an abutting relationship and being substantially parallel throughout a major portion of their surface areas when the two screens are brought together and held by said securing means with the fixture empty.

5. The fixture defined by claim 4, wherein the wire mesh is stainless steel.

6. The fixture defined by either of claims 1 or 4 further comprising means for reinforcing the sides of the front and rear screens.

7. The fixture defined by claim 6, wherein said reinforcing means for the sides of the front and rear screens comprise rigid flat metal strips on outward facing surfaces of the front and rear screens.

8. The fixture defined by either of claims 1 or 4, wherein the fixture is coated with a material which resists wetting by molten solder.

9. The fixture defined by claim 8, wherein the coating material comprises TEFLON.

10. The fixture defined in either of claims 1 or 4 wherein said securing means is also of a material which is non-wettable by and can withstand the temperature of molten solder.

11. The fixture defined in either of claims 1 or 4 further comprising a reinforcing strip attached to the top of each of said front and rear screens, said securing means contacting said reinforcing strip.

* * * * *